United States Patent
Marten

(10) Patent No.: US 6,512,471 B2
(45) Date of Patent: Jan. 28, 2003

(54) INTENTIONALLY NON-MONOTONIC DIGITAL-TO-ANALOG CONVERTER

(75) Inventor: Victor Marten, Flushing, NY (US)

(73) Assignee: Semtech Corporation, Camarillo, CA (US)

( * ) Notice: Subject to any disclaimer, the term of this patent is extended or adjusted under 35 U.S.C. 154(b) by 177 days.

(21) Appl. No.: 09/958,502

(22) PCT Filed: Jan. 24, 2001

(86) PCT No.: PCT/US01/02390
§ 371 (c)(1),
(2), (4) Date: Jun. 11, 2002

(87) PCT Pub. No.: WO01/56163
PCT Pub. Date: Aug. 2, 2001

(65) Prior Publication Data
US 2002/0171575 A1 Nov. 21, 2002

Related U.S. Application Data

(60) Provisional application No. 60/178,887, filed on Jul. 28, 2000.

(51) Int. Cl.$^7$ .............................................. H03M 1/12
(52) U.S. Cl. ...................................... 341/144; 341/153
(58) Field of Search .................................. 341/144, 153, 341/154, 141

(56) References Cited

U.S. PATENT DOCUMENTS

| | | | |
|---|---|---|---|
| 4,875,046 A | 10/1989 | Lewya | 341/148 |
| 6,130,635 A | 10/2000 | Jones, III | 341/72 |
| 6,384,762 B2 | 5/2002 | Brunolli et al. | 341/144 |

*Primary Examiner*—Peguy JeanPierre
(74) *Attorney, Agent, or Firm*—Oppedahl & Larson LLP

(57) ABSTRACT

A digital-to-analog converter comprises capacitor stack (61, 62), the common point of which is the output of the converter. Digitally controlled switches (66–70), which may be discrete outputs from a microcontroller, selectively apply first or second potentials to points in the capacitor stack, either directly (66, 70) or through resistors (63–65).

6 Claims, 5 Drawing Sheets

US 6,512,471 B2

INTENTIONALLY NON-MONOTONIC DIGITAL-TO-ANALOG CONVERTER

This application claims priority from U.S. appl. No. 60/178,887, filed Jan. 28, 2000, which application is incorporated herein by reference to the extent permitted by law.

BACKGROUND

Accurate high-resolution control voltages are not easy to generate quickly. Generated voltages can be accurate and can have high resolution and can be quickly generated (short settling time) so long as the designer is willing to incur high cost and great circuit complexity. For example, high-cost monolithic digital-to-analog (D/A) integrated circuits are available which provide guaranteed resolution and linearity.

If the designer is wing to tolerate a very long settling time, the generating circuit can be less expensive. For example, a so-called delta-sigma architecture may be used, which is basically a pulse width modulator followed by a low-pass filter.

Another prior-art approach, shown in FIG. 1, is to employ two or more D/A convertors 22, 24 with appropriate gain or attenuation blocks 23, 25 prior to a linear summation stage 20 having an output 21. These components taken together are a composite D/A convertor 103. In FIG. 1, D/A convertor 22 is the "coarse" convertor, where each stepwise change in the input control lines 101 makes a large change in the output of the convertor 22. D/A convertor 24 is the "fine" convertor, where each stepwise change in the input control lines 102 makes a small change in the output of the convertor 24. The usual design goal is to adjust the gain or attenuation blocks 23, 25 so that the composite D/A convertor 103 comes as close as possible to having a linear transfer characteristic as possible. On a practical level, however, there is finite accuracy of the individual elements, there are temperature tracking problems, etc. As a consequence, it is not possible to create a monotonic composite D/A convertor 103 with constant and equal steps everywhere over the entire output range.

The designers of the systems described above are typically designing for a system where it is desired to be able to generate an arbitrary output voltage level without any knowledge of the previous setting of the D/A convertor. Stated differently, every required output voltage level 21 is generated unambiguously from a single setting of the digital control lines 101, 102. Such systems are particularly helpful in cases lacking feedback, that is, in open-loop applications. As such, however, the systems suitable for such open-loop applications are, as mentioned above, very expensive or very slow to settle or both.

It is desirable, then, to consider whether there are applications which require D/A convertors but where the circumstances (e.g. availability of feedback, absence of any requirement of overall monotonicity) permit completely different approaches to generation of analog control signals based on digital inputs.

SUMMARY OF THE INVENTION

A digital-to-analog convertor is described which provides accurate and high-resolution results in particular constrained applications where feedback is available and where there is no need for monotonicity across the entire dynamic range. The convertor comprises a capacitor stack, the common point of which is the output of the convertor. Digitally controlled switches, which may be discrete outputs from a microcontroller, selectively apply first or second potentials to points in the capacitor stack, either directly or through resistors. Appropriate control of the switches permits developing desired output voltages quickly and accurately. Performance equivalent to 24-bit 1 least-significant-bit (LSB) accuracy is easily attainable even with components having 5% tolerance.

DESCRIPTION OF THE DRAWING

The invention will be described with respect to a drawing in several figures, of which.

Where possible, like elements have been denoted among the figures using like reference numerals.

DETAILED DESCRIPTION

Figure 1:
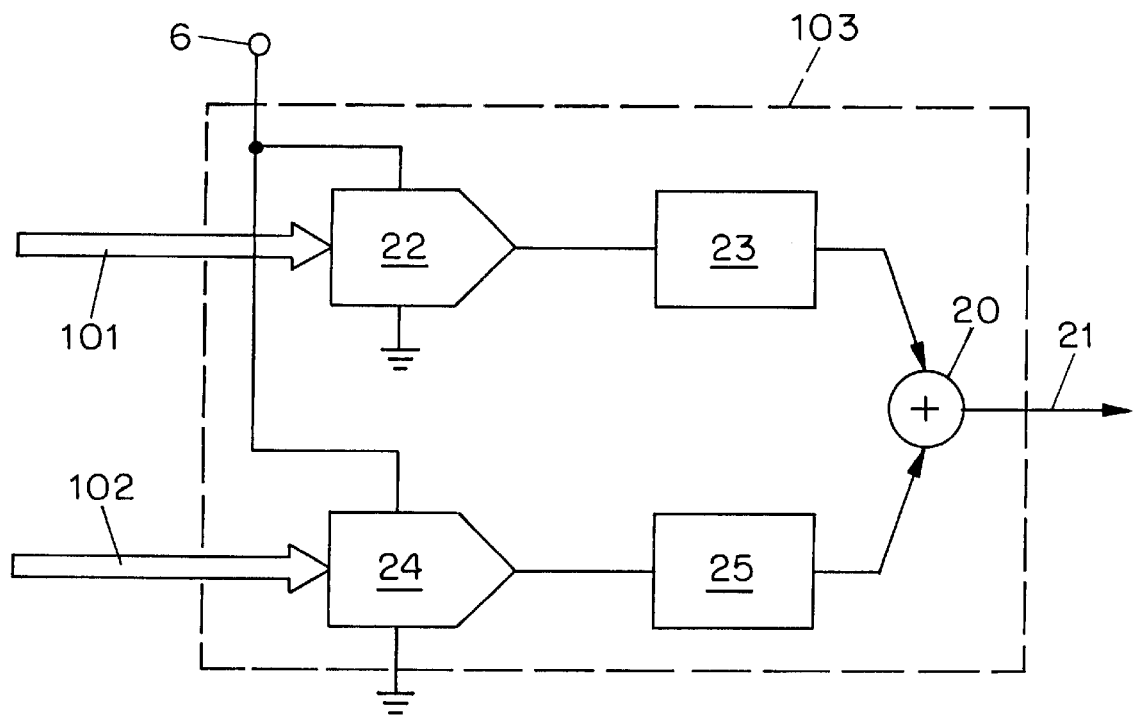
FIG. 1 is a functional block diagram of a composite D/A convertor which, with appropriate configuration, performs as in the prior art.

As mentioned above, many prior-art designers of a composite D/A convertor 103 (FIG. 1) would feel compelled to select gains and attenuations 23, 25 so that the output 21 is nearly monotonic. In such a design, the most-significant bit of the input 102 to the "fine" D/A 24 makes a smaller change in the output than the least-significant bit of the input 102 to the "coarse" D/A 22.

Figure 2:
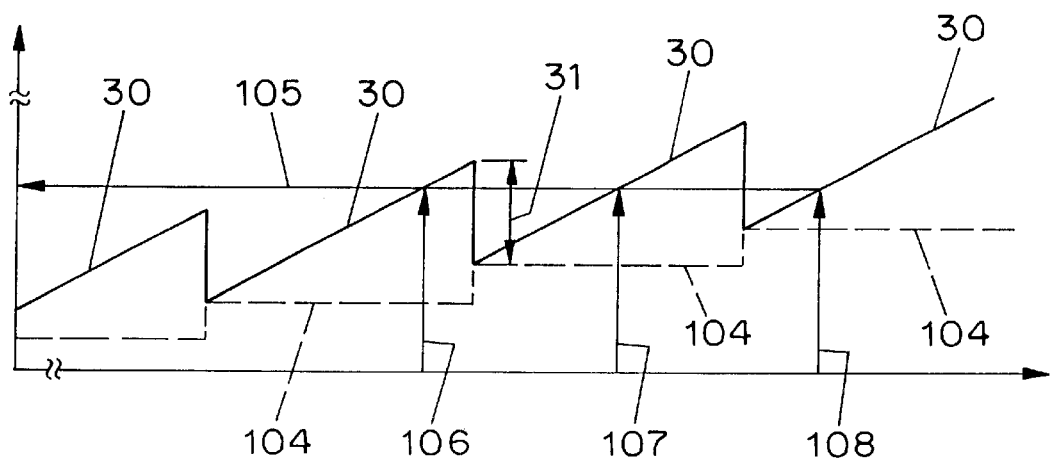
FIG. 2 is a graph showing output voltage as a function of digital control signal for a D/A convertor such as in FIG. 1, depending on the configuration.

Consider, however, what happens if the constraint just stated is released. If this constraint is released, then the designer might well be permitted to select gains and attenuations so that the most-significant bit of the input 102 to the "fine" D/A 24 makes a larger change in the output than the least-significant bit of the input 102 to the "coarse" D/A 22. One possible result might be that shown in FIG. 2. In FIG. 2, there are so-called "linear" regions 30 which are due to the output of the "fine" D/A 24. In the hypothesized arrangement, the full-scale output change from D/A 24 is greater thin one or several of the smallest steps from the "coarse" D/A 22.

In FIG. 2, this is depicted with dotted lines 104 representing the smallest steps from the output of the "coarse" D/A 22.

In such an arrangement, we can define an "overlap" 31 which represents the extent to which two different linear regions 30 may overlap in voltage. The existence of such overlaps leads to the result that an output voltage 105 might be generated by digital input 106 or digital input 107 or digital input 108. (Each of these digital inputs is defined as the combined inputs of lines 101 and 102 in FIG. 1.) Stated differently, knowing the particular output voltage 105 does not unambiguously determine which of several possible inputs 106, 107, 108 is presently giving rise to the particular output voltage 105.

Such an arrangement is not useful in all systems, but may be useful in systems where several conditions are satisfied. First, the system must provide some sort of feedback of the output voltage. Second, the system must not require linearity over the entire dynamic range, but instead must be capable of accomplishing its goals drawing upon linearity only within reasonably small parts of the whole dynamic range. A related condition is that the system must be capable of accommodating that a change from one output voltage setting to another may not be monotonic in the event that the magnitude of the change exceeds the linear adjustment range. If the system does not require outputs that stay the same for long periods of time, but instead only requires "pulsed" outputs (outputs that are known to be correct only for predetermined brief intervals) then the D/A convertor can be simplified and further reduced in cost.

As it turns out, a D/A arrangement can be devised which works within these conditions and which provides good differential accuracy. Stated differently, it turns out to be possible to devise a D/A arrangement for which the smallest possible adjustment step at any particular point in the range is the same (in voltage as a function of step) at all or nearly all other points in the range.

Figure 3:
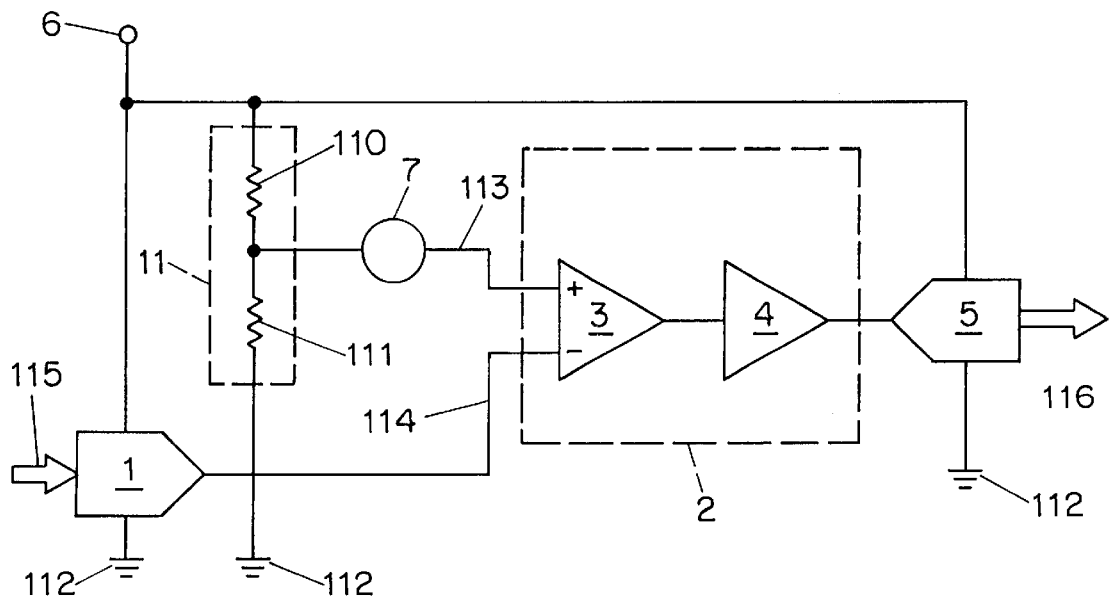
FIG. 3 is a general model of a resistor bridge measurement application, depicting a generalized error signal.

Before describing an actual circuit for developing such intentionally non-monotonic D/A voltages, it is instructive to consider a particular application of a D/A convertor. FIG. 3 is a general model of a resistor bridge measurement application, depicting a generalized error signal 7. In FIG. 3, the resistor bridge is defined by sensor 11, modeled by resistors 110, 111, and by D/A convertor 1. In this way, two nodes of the resistor bridge, namely the excitation nodes, are a reference voltage 6 and a defined ground potential 112. The other two nodes 113, 114 of the resistor bridge serve as inputs to differential amplifier 3. Differential amplifier 3 feeds an amplifier 4 which has a fixed gain. These two amplifiers collectively are defined as instrumentation amplifier 2. The output of instrumentation amplifier 2 is an input to an A/D convertor 5, having a digital output 116.

As an example of a real-life application where the circuitry of FIG. 3 might be used may be seen in a single axis of a touch pointer or touch pad, being a pointing device for a personal computer. In such an application, resistors 110, 111 vary as a function of force applied to the touch pointer or vary as a function of touch position on a touch pad. The goal, of course, is for the digital output 116 to convey faithfully the force upon the touch pointer or the touch position on the touch pad.

For convenience of analysis we represent all system amplification errors as a single error voltage 7. After the D/A convertor 1 is initially adjusted for the general system conditions, then the only required changes in the output of the D/A convertor 1 are the changes needed to track and correct for errors developing at the generalized error signal 7. In such a system as that shown in FIG. 3, it is possible to select gains within the composite D/A convertor 1 so that the maximum time-varying error 7 is well within a linear region of the convertor 1.

Figure 4:
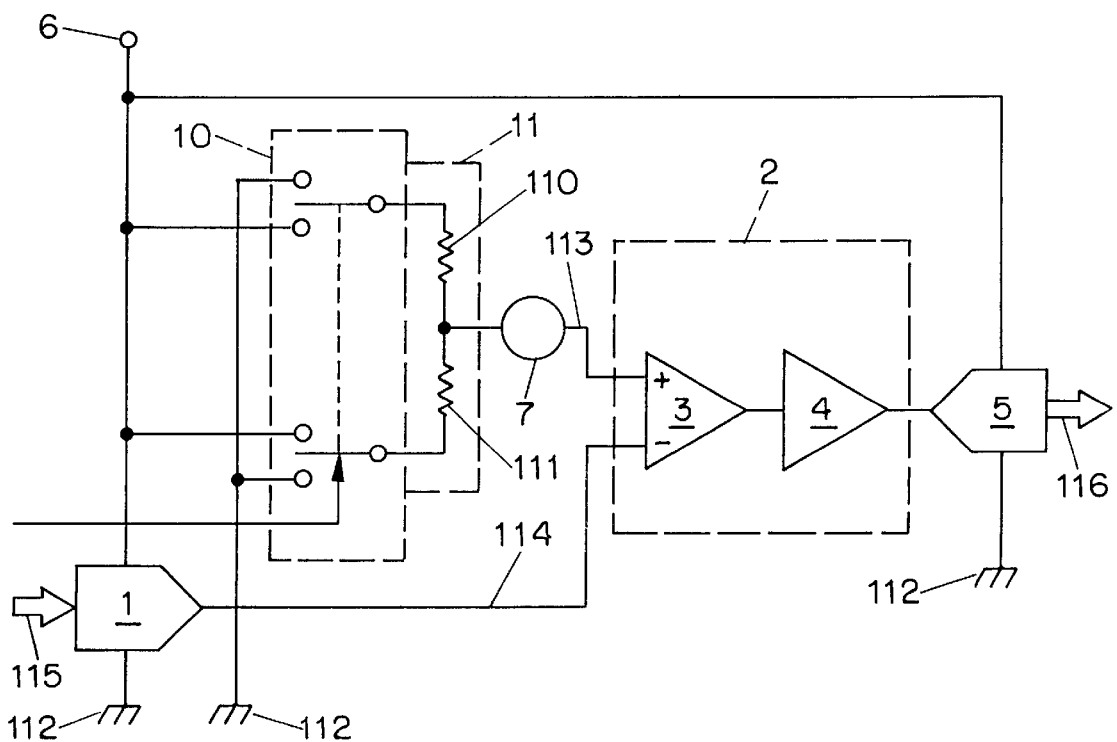
FIG. 4 is the general model of a resistor bridge measurement application of FIG. 3, depicting a generalized error signal, but with a switching feature which permits correcting for much of the error signal.

Suppose it is desired to cancel out the error 7, typically because it is desired to measure the data from the sensor 11 as a change from a "zero" or rest position. FIG. 4 shows one approach toward this goal, using a switching feature which permits correcting for much of the error signal. Double-pole double-throw switch 10 is interposed in circuitry which otherwise matches that of FIG. 3. In a typical sequence, switch 10 is in the lower position, with resistor 110 connected to potential 6 (e.g. V+) and resistor 111 connected to potential 112 (e.g. ground). A first measurement is made yielding a digital output 116. Next, switch 10 is placed in the upper position, with resistor 110 connected to potential 112 (e.g. ground) and resistor 111 connected to potential 6 (e.g. V+). A second measurement is made yielding a digital output 116. Each measurement has an associated offset voltage generated at the output of D/A 1, these offsets being different, one for the first measurement and one for the second measurement. In software, the two measured values at the digital output 116 are averaged to arrive at a value which is presumed to be nearly correct. The difference between the two measured values at the digital output 116 is divided by two and this value is used to adjust the offset voltages generated at the output of D/A 1, each adjusted by the same amount in the same direction.

In this way, the error common to both measurements (the error modeled as the generalized error 7) is detected and corrected.

From this it may be appreciated that the chief reason why D/A 1 is adjusted is to ensure that the amplifier 2 is kept within its linear operating region, and that the output of the amplifier 2 is within the permissible input range of the A/D convertor 5, for each of the two measurements (that is, the measurement with switch 10 in the lower position and with the switch 10 in the upper position).

Assuming that D/A 1 is non-monotonic, for example having an output varying as shown in FIG. 2, then the sequence of measurements just described works properly only if the range of outputs needed from D/A 1 falls within one of its linear regions, as mentioned earlier. What's more, the adjustments described to correct for the error 7 will work properly only if smallest possible adjustment step at any particular point in the range is the same (in voltage as a function of step) at all or nearly all other points in the range. That is, the adjustments described to correct for the error 7 work only if the D/A convertor 1 has good differential accuracy.

From the discussion above in connection with FIGS. 2, 3, and 4, it may now be appreciated that there is indeed at least one real-life system in which it is not a severe drawback that the D/A convertor is non-monotonic, so long as there is some feedback and so long as the D/A convertor has good differential accuracy and offers good resolution. In such a system, it turns out to be possible to provide such a D/A convertor very inexpensively. The components of the convertor need not be close-tolerance parts, but can have 5% tolerance or worse. The parts count is small and the entire convertor is quite inexpensive. The inexpensive and yet accurate and high-resolution D/A convertor is shown in FIG. 5.

Figure 5:
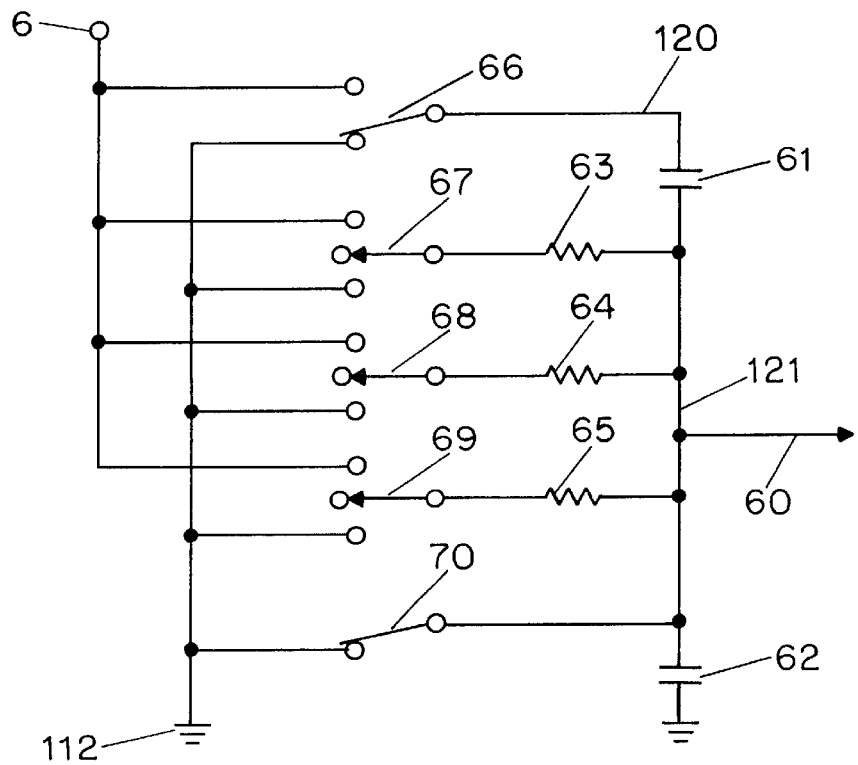
FIG. 5 is a circuit schematic of a D/A convertor according to the invention.

FIG. 5 is a circuit schematic of a D/A convertor according to the invention. The D/A convertor works with respect to first and second potentials 6, 112, typically being V+ and ground. Its output is line 60. Digitally controlled switches 66, 67, 68, 69 and 70 are provided. Switch 66 has two contacting positions. Switches 67, 68, and 69 are tri-state, having two contacting positions and a floating position. Switch 70 has two positions, one of which is contacting and one of which is floating. Resistors 63, 64, and 65 are provided, the resistors differing from each other in value as will be characterized below. A capacitor stack is defined by capacitors 61, 62.

Stated differently and somewhat more generally, the inventive apparatus has an output line 60. The apparatus has first, second, and third nodes 120, 121, 122, said second node 121 defining the output line 60. A first capacitor 61 is provided between the first and second nodes 120, 121. A second capacitor 62 is provided between the second and third nodes 121, 122. A first switch 66 selectably connects the first node 120 to either a first potential 6 or a second potential 112. A second switch 67 selectably connects the second node 121 via a first resistor 63 to the first potential 6, to the second potential 112, or to an open connection. A third switch 68 selectably connects the second node 121 via a second resistor 64 to the first potential 6, to the second potential 112, or to an open connection, said second resistor 64 smaller in value than the first resistor 63. A fourth switch 70 selectably connects the second node 121 to the second potential 112 or to an open connection. The first switch 66, second switch 67, third switch 68, and fourth switch 70 are each controlled by digital circuitry.

Optionally and preferably, the inventive apparatus also has a fifth switch 69 selectably connecting the second node 121 via a third resistor 65 to the first potential 6, to the second potential 112, or to an open connection, the third resistor 65 smaller in value than the second resistor 64.

Figure 6:
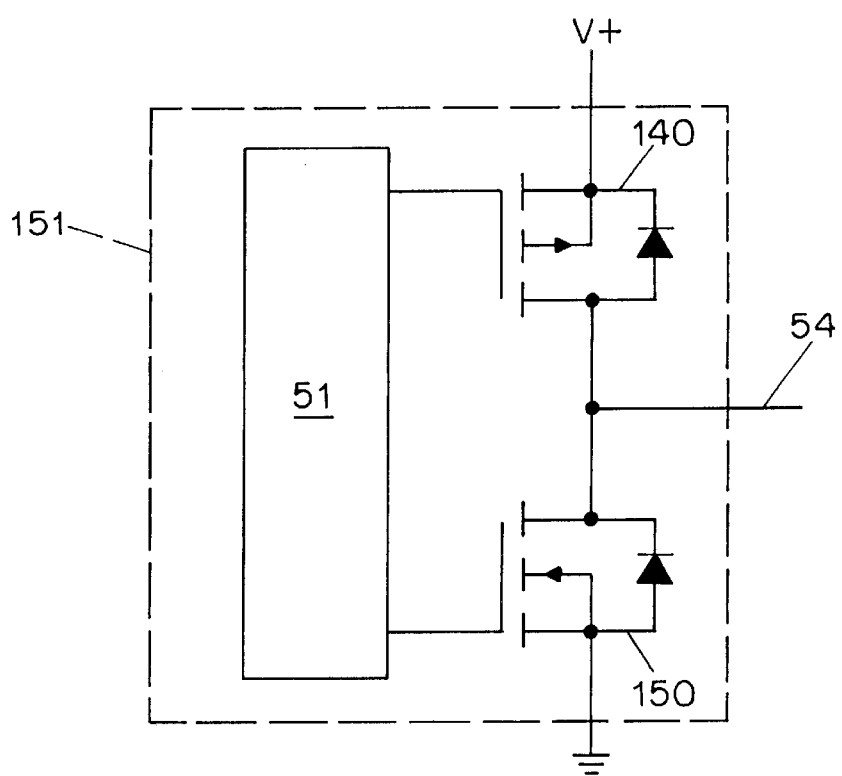
FIG. 6 shows a typical component-level switch of the type used in the convertor of FIG. 5.

Before turning to the detailed operation of the inventive apparatus, it is helpful to describe a typical way to provide the switches 66, 67, 68, 69 and 70. FIG. 6 shows a typical component-level switch 151 which may be an output pin of a general-purpose microcontroller. Semiconductor switches 140, 150 are preferably FETs. If FET 140 is turned on, then V+ is connected to the output 54. If FET 150 is turned on, then ground is connected to the output 54. If neither FET is turned on, then the output 54 is allowed to float. In this way the switch 151 can be a tri-state switch. Control circuitry 51 ensures that FETs 140, 150 are never turned on simultaneously, and thus saves the FETs 140, 150 from destruction due to high current passing between V+ and ground.

As mentioned above, the measurement regime of FIGS. 3 and 4 is able to work with merely pulsed D/A outputs, and does not require that the D/A outputs remain constant and stable for long periods of time. For the rest of the time the D/A outputs are allowed to be undetermined. As will be seen, in this example the D/A outputs are at ground potential during times when no particular controlled output voltage is required. The system design assumes that the A/D convertor 5 (FIGS. 3 and 4) takes reference voltages from the same places as the references voltages for the D/A convertor (and for the rest of the resistor bridge, namely for the sensor 11).

The sequence of steps for digital-to-analog conversion will now be described, and it may be helpful to refer to FIGS. 7a and 7b to follow the sequence.

Initially the convertor is in an idle or resting state 160. All of the switches 66, 67, 68, 69, 70 are connected to ground. This fully discharges capacitors 61, 62. The output 60 is at ground.

Next, all switches 67, 68, 69, 70 are set to a floating state, while switch 66 remains set to ground. Output 60 of course remains at ground.

Node 120 is connected to supply voltage 6 by switching switch 66 to the upper position. The capacitors get charged and define a voltage divider. Node 121 and thus output 60 quickly acquire a voltage:

$$V_0 = V + \cdot C1/(C1+C2)$$

where C1 and C2 are the capacitance of capacitors 61 and 62 respectively.

Next, a "fine" D/A conversion is performed by connecting node 121 to V+ through resistor 63 via switch 67, for a duration $T_1$. During this duration $T_1$, the voltage at node 121 increases slowly, modeled as:

$$V_{OUT(T1)} = V_0 + (V+ - V_0)(1 - \exp(-T_1/RC_1))$$

where time constant $RC_1$ is defined as resistor 63 times the sum of capacitors 61, 62.

In a typical case where resistor 63 is large, then for typical durations $T_1$, the increase in voltage is nearly linearly proportional to the time $T_1$. In this way, the good differential accuracy is provided.

Next, a "coarse" D/A conversion is performed by connecting node 121, through resistor 64, to ground for a duration $T_2$, and then to V+ for a duration $T_3$, with $T_2$ and $T_3$ selected to add up to a constant. The output of the circuit may then be modeled as:

$$V_{OUT} = (V_0 + (V+ - V_0)(1 - \exp(-T_1/RC_1)))\exp(-(T_2+T_3)/RC_2) + V+ \cdot (1 - \exp(-T_3/RC_2))$$

where time constant $RC_2$ is defined as resistor 64 times the sum of capacitors 61, 62.

Figure 7A:
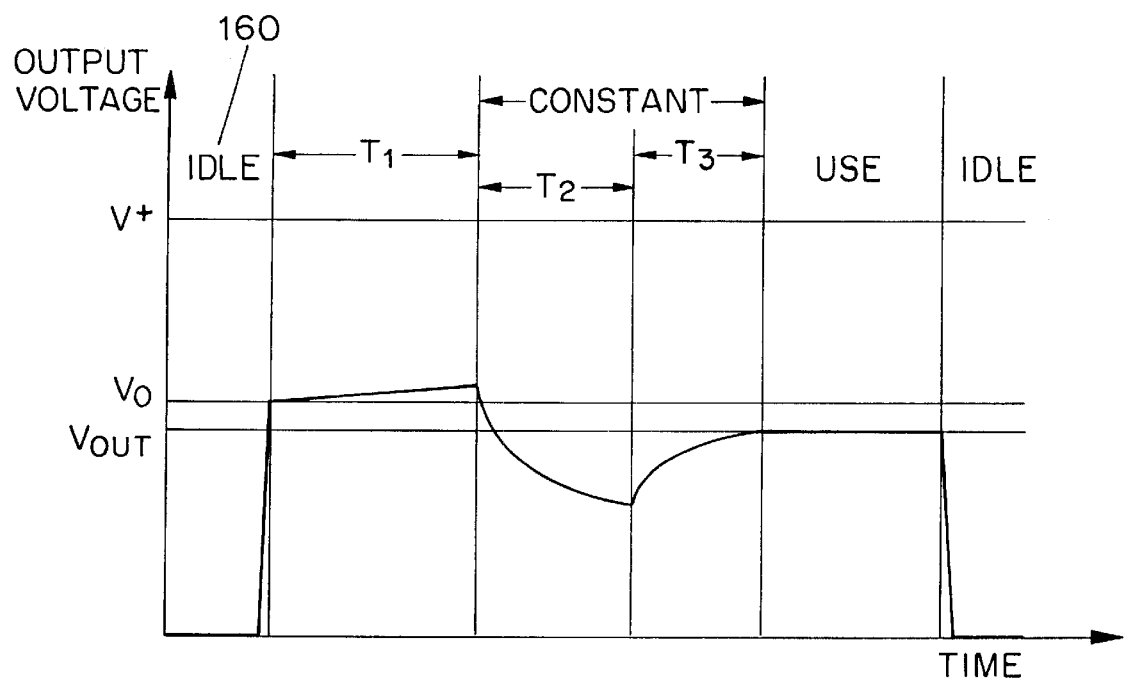
FIG. 7a shows the developed output voltage as a function of time of the convertor of FIG. 5 for a first set of inputs.
Figure 7B:
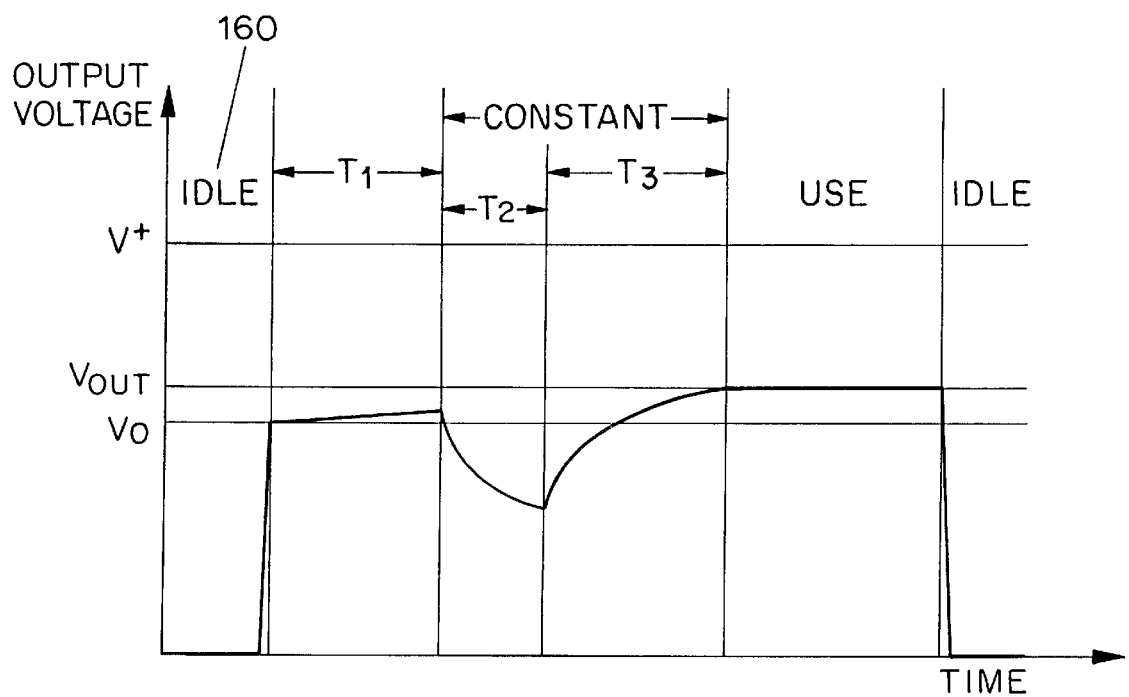
FIG. 7b shows the developed output voltage as a function of time of the convertor of FIG. 5 for a second, different set of inputs.

FIGS. 7a and 7b show the output voltage as a function of various choices for $T_1$, $T_2$, and $T_3$. It will be appreciated that, as shown in FIG. 7a, if $T_2$ is long, then the final output voltage is lower than the voltage at the end of interval $T_1$. In contrast, as shown in FIG. 7b, if $T_3$ is long, then the final output voltage is higher than the voltage at the end of interval $T_1$.

One skilled in the art will appreciate that the choice of potential is arbitrary—the "fine" D/A conversion could equally well be performed by connecting node 121 to ground (through appropriate resistors) instead of to V+ for the duration $T_1$, and the "coarse" conversion by connecting node 121 to V+ (through appropriate resistors) for duration $T_2$, and then connecting node 121 to ground (through appropriate resistors) for duration $T_3$.

It will be appreciated that the sequence of adjustment in this inventive system is precisely the opposite of what common wisdom would suggest. In many prior-art systems one makes a large or "coarse" adjustment first, followed by a small or "fine" adjustment. In this inventive apparatus, however, the "fine" adjustment is made first, and next the "coarse" adjustment is performed.

It will be appreciated that the system could minimally function eliminating all resistors except one resistor 63 and eliminating all tri-state switches except tri-state switch 67. Such a system would be rather slow to arrive at a desired output voltage. Providing resistor 64 which is smaller than resistor 63 permits a fairly fast "coarse" adjustment, and this means that the entire settling time is much faster (that is, much shorter) as compared with a system using only one resistor.

As mentioned above, optionally a third resistor 65 is provided, even smaller in value than resistor 64. This permits a third, even "coarser" D/A conversion, so that the entire conversion is accomplished in an even shorter settling time.

Stated differently, the method for D/A conversion is as follows. The first and second nodes 120, 121 are connected to a second potential 112. Next, the second node 121 is disconnected from the second potential 112. The first node 120 is disconnected from the second potential 112 and is connected to the first potential 6. The second node 120 is connected to a first one of the first and second potentials 6, 112 through a resistance 63 for a first time interval Next, the second node 121 is connected to the second one of the first and second potentials 6, 112 through a resistance 64 for a second time interval. Finally, the second node 121 is connected to the first one of the first and second potentials 6, 112 through the resistance 64 for a third time interval.

Again referring to the arbitrariness of the signs, the first one of the first and second potentials 6, 112 can be the first potential 6, whereby the second one of the first and second potentials 6, 112 is the second potential 112.

Alternatively, the first one of the first and second potentials 6, 112 can be the second potential 112, whereby the second one of the first and second potentials 6, 112 is the first potential 6.

Optionally, where a third resistor 65 is provided, which is even smaller in value than the second resistor 64, then additional method steps are: connecting the node 121 is connected to the second one of the first and second potentials 6, 112 through the resistance 65 for a fourth time interval and the second node 121 is connected to the first one of the first and second potentials 6, 112 through the resistance 65 for a fifth time interval.

Figure 8:
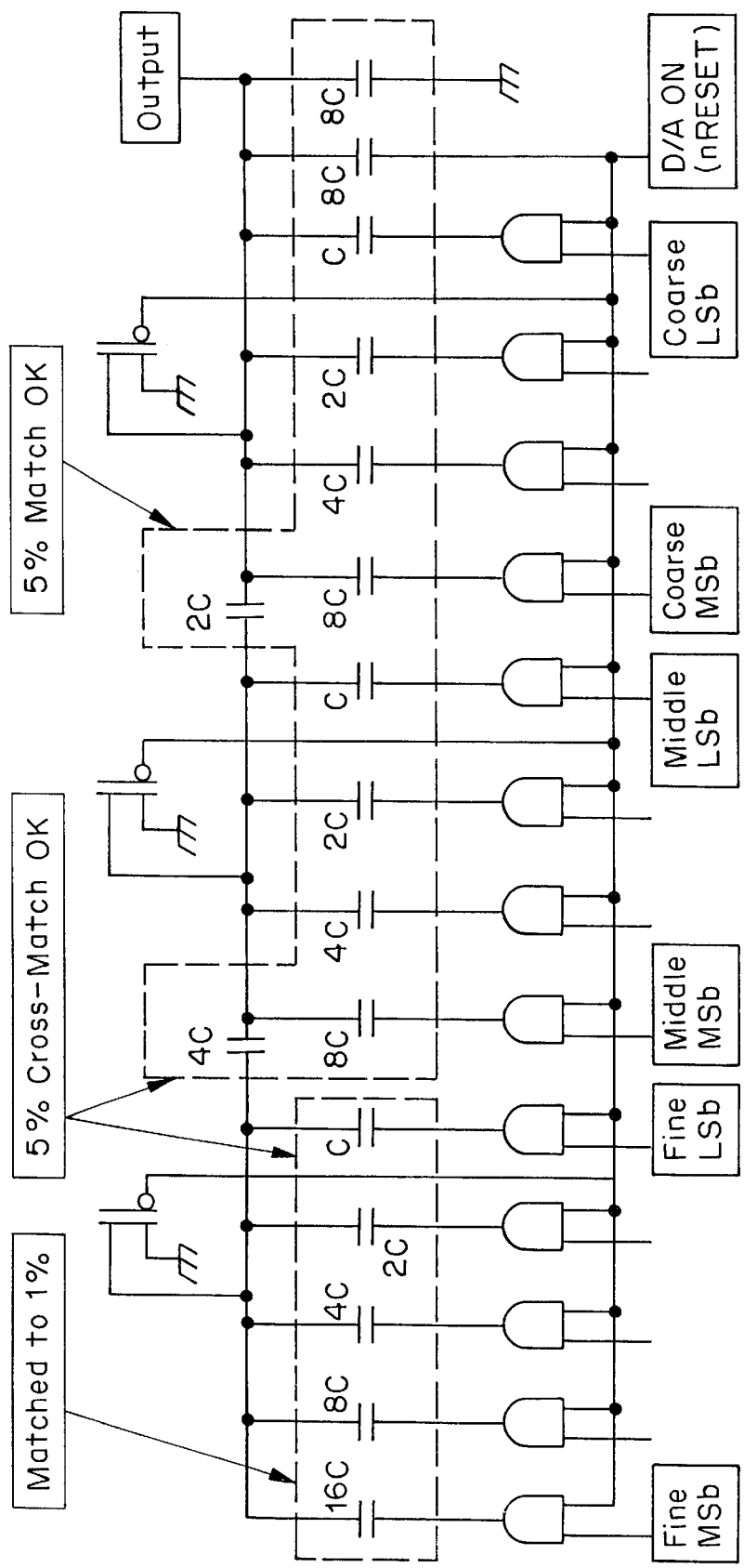
FIG. 8 shows a generalization of the convertor of FIG. 5, designed for incorporation onto an integrated circuit, with 12 bits of digital control signal.

FIG. 8 shows a generalization of the convertor of FIG. 5, designed for incorporation onto an integrated circuit, with 12 bits of digital control signal.

Those skilled in the art will have no difficulty devising myriad obvious variations and improvements upon the invention without departing from the invention in any way, all of which are intended to be encompassed by the claims that follow.

What is claimed is:

1. Apparatus having an output line comprising:
   first, second, and third nodes, said second node defining the output line;
   a first capacitor between the first and second nodes;
   a second capacitor between the second and third nodes;
   a first switch selectably connecting said first node to either a first potential or a second potential;
   a second switch selectably connecting said second node via a first resistor to the first potential, to the second potential, or to an open connection;
   a third switch selectably connecting said second node via a second resistor to the first potential, to the second potential, or to an open connection, said second resistor smaller in value than the first resistor;
   a fourth switch selectably connecting said second node to the second potential or to an open connection;
   said first switch, second switch, third switch, and fourth switch each controlled by digital circuitry.

2. The apparatus of claim 1 further comprising:
   a fifth switch selectably connecting said second node via a third resistor to the first potential, to the second potential, or to an open connection, said third resistor smaller in value than the second resistor.

3. A method for use with apparatus comprising a first capacitor between first and second nodes and a second capacitor between the second node and a third node, said second capacitor defining an output, said method defined with respect to first and second potentials, said method defined with respect to first and second resistors, the second resistor smaller in value than the first resistor, said third node connected to said second potential, said method comprising the steps of:
   connecting said first and second nodes to the second potential;
   disconnecting the second node from the second potential;
   disconnecting the first node from the second potential and connecting it to the first potential;
   connecting the second node to a first one of the first and second potentials through the first resistance for a first time interval;
   connecting the second node to the second one of the first and second potentials through the second resistance for a second time interval; and
   connecting the second node to the first one of the first and second potentials through the second resistance for a third time interval.

4. The method of claim 3 wherein the first one of the first and second potentials is the first potential, whereby the second one of the first and second potentials is the second potential.

5. The method of claim 3 wherein the first one of the first and second potentials is the second potential, whereby the second one of the first and second potentials is the first potential.

6. The method of claim 3 further defined with respect to a third resistor, the third resistor smaller in value than the second resistor, said method further comprising the steps of:
   connecting the second node to the second one of the first and second potentials through the third resistance for a fourth time interval; and
   connecting the second node to the first one of the first and second potentials through the third resistance for a fifth time interval.

* * * * *